United States Patent [19]

King

[11] 3,959,808
[45] May 25, 1976

[54] VARIABLE STRIPE WIDTH SEMICONDUCTOR LASER

[75] Inventor: Frederick David King, Smith Falls, Canada

[73] Assignee: Northern Electric Company Limited, Montreal, Canada

[22] Filed: Sept. 19, 1974

[21] Appl. No.: 507,453

[52] U.S. Cl. .................................. 357/18; 357/16; 357/17; 331/94.5 H
[51] Int. Cl.² ................. H01S 33/19; H01L 29/161
[58] Field of Search ......................... 357/18, 17, 16; 331/94.5 H

[56] References Cited
UNITED STATES PATENTS

| | | | |
|---|---|---|---|
| 3,431,512 | 3/1969 | Redfield | 331/94.5 |
| 3,551,842 | 12/1970 | Nelson | 331/94.5 |
| 3,702,975 | 11/1972 | Miller | 331/94.5 |

*Primary Examiner*—Martin H. Edlow
*Attorney, Agent, or Firm*—Sidney T. Jelly

[57] ABSTRACT

A variable stripe width semiconductor laser is provided in which, in addition to the contact stripe and back contact, a third contact is provided. By applying a positive bias to the third contact the current spread in the device is reduced, increasing the effective current density at the lasing position. By varying, or pulsing, the applied position bias the current density can be caused to vary above and below a threshold and switch the laser on and off. Further, by application of a suitable positive bias, unwanted higher order modes can be eliminated.

5 Claims, 5 Drawing Figures

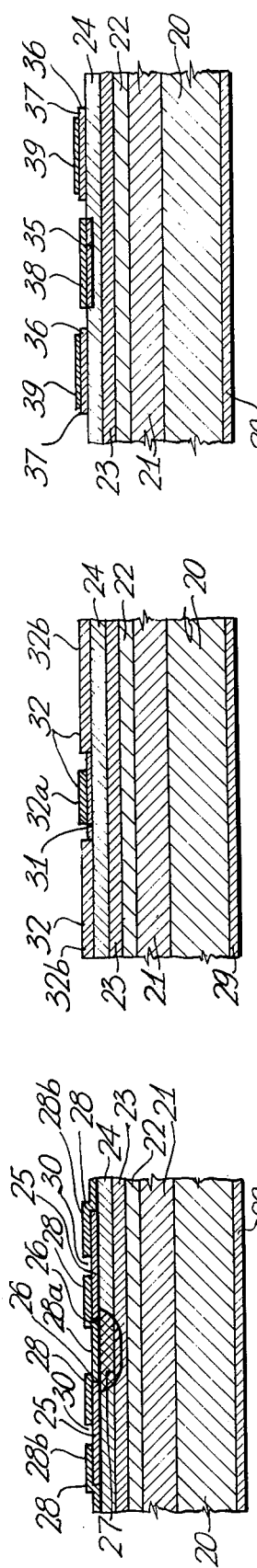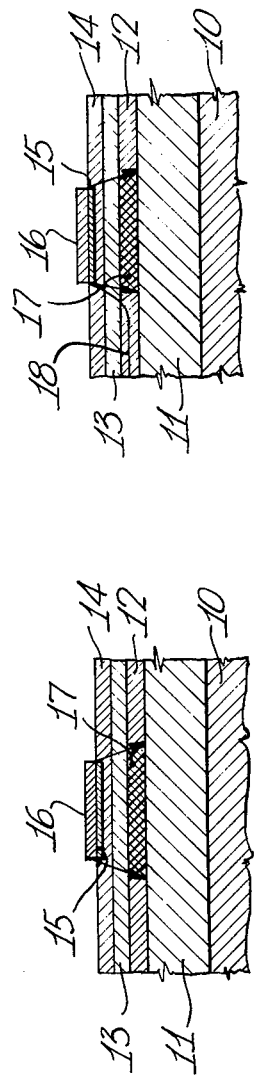

VARIABLE STRIPE WIDTH SEMICONDUCTOR LASER

This invention relates to variable strip width semiconductor lasers and is concerned with the provision for varying the stripe width of conventional semiconductor lasers.

In a conventional stripe contact device, current spreading occurs. The invention provides for controlling and selectively reducing the current spread and provides a low power, fast means for switching a laser on and off — for modulation for example — and also provides a means of eliminating unwanted higher order modes.

In its broadest aspect, in accordance with the invention, by applying a positive bias to a third contact in a device through which is passed a constant current, current density in the active region can be increased. This can be used to switch a laser from below to above threshold for example.

The invention will readily be understood by the following description of certain embodiments, by way of example, in conjunction with the accompanying diagrammatic drawings, in which:

FIG. 1 is a cross-section through a conventional device, illustrating current spread;

FIG. 2 is a cross-section similar to that of FIG. 1, illustrating the reduction in current spread by a depleted region;

FIG. 3 is a cross-section through one form of device in accordance with the invention;

FIG. 4 is a cross-section through a further form of device;

FIG. 5 is a cross-section through another form of device.

FIG. 1 illustrates a typical stripe contact semiconductor laser device. The device is an AlGaAs heterojunction device and comprises a substrate 10 on which are grown four layers 11, 12, 13 and 14. Layers 11 and 13 are confining layers and are of N-AlGaAs and P-AlGaAs respectively. Layer 12 is the active layer and is of P-GaAs and layer 14 is a capping layer of P-GaAs. Layer 12 can often be either P or N type independent of layers 11 and 13.

Contact is made to the capping layer 14 by first skin diffusing a stripe 15, of width L. A metal contact stripe 16 is then formed on the diffused stripe 15. Application of a voltage produces a lasing region indicated at 17. The current spreads in the layers 12 and 13 and 14 so that the width of the lasing region 17 is wider than the stripe width L. The current density at the lasing region is lower than at the contact 16.

In accordance with the present invention, by applying a voltage to the device by a further contact, the current spread can be reduced. Thus as illustrated in FIG. 2, assuming the application of a voltage via a contact, not shown, the width of the lasing region 17 is reduced, relative to FIG. 1, and is only slightly wider than the stripe width L. The current density in the lasing region 17 is increased as compared to the density in region 17 in FIG. 1 for the same current density at the contact 16. The limit of the depletion region on one side of the lasing region is indicated by line 18.

FIG. 3 illustrates one form of device in accordance with the invention, comprising a p-n junction device. The device comprises a substrate 20 of semiconductor material of N or P type conductivity and four grown layers 21, 22, 23 and 24. The layers 21, 22, 23 and 24 can be grown by any known method and apparatus, for example as described in Canadian Pat. No. 902,803, issued June 13, 1972 or as described in "Preparation of GaAs p-n Junctions" by B. I. Miller and H. C. Casey Jr., paper 24, 1972 Symposium on GaAs.

A typical procedure is to pass a substrate wafer sequentially beneath four reservoirs holding epitaxy solutions, with a predetermined temperature reduction at each reservoir. Examples of the melts in the four reservoirs are as follows, the dopant concentration in milligrams per 4 gram melt, the growth temperature being from 830° to 817°C in the known manner.

| Layer | Type | Al | Te | Ge | Thickness ($\mu$m) | Carrier Conc. |
|---|---|---|---|---|---|---|
| 21 | n-Ga$_{0.65}$Al$_{0.35}$As | 6 | 2 | — | ≈3 | >5 × 10$^{17}$ cm$^{-3}$ |
| 22 | p-Ga$_{0.95}$Al$_{0.05}$As | 1 | — | — | <1.0 | <2 × 10$^{16}$ cm$^{-3}$ |
| 23 | p-Ga$_{0.65}$Al$_{0.35}$As | 7 | — | 20 | ~1.5 | <1 × 10$^{17}$ cm$^{-3}$ |
| 24 | n-GaAs | — | .25 | — | ~1.0 | ≈5 × 10$^{17}$ cm$^{-3}$ | an alternative for the active layer is:

| 22 | n-Ga$_{0.95}$Al$_{0.05}$As | 1 | Sn | — | <1.0 | <2 × 10$^{16}$cm$^{-3}$ |

The substrate 20 is of the same type as layer 21, that is n-type. It is possible to reverse the type of the layer, that is have substrate 20 and layer 21 p-type and layers 23 n-type and 24 n-type.

After growing of the layers 21, 22, 23 and 24 subsequent cleaning of the wafers, a plurality of devices are formed thereon.

A typical process for producing a number of devices on a wafer are as follows:

a. deposit approximately 5000A of phosphorus doped Si$_t$O$_2$ on layer 24 by CVD - layer 25;

b. open 8$\mu$ stripes on 20 mil centres in oxide layer 25, using convention photolithographic etching technique, using buffered HF acid, to produce windows 26;

c. zinc diffuse into the windows 26 until diffusion front reaches into layer 23 — to form diffusion zones 27, — typically 30 minutes in a capsule with ZnAs$_2$ source at 700°C;

d. open 50$\mu$ stripes on 20 mil centres in oxide layer 25, using conventional photolithographic etching techniques with buffered HF acid, the stripes parallel to and central between original 8$\mu$ stripes;

e. evaporate 200A Au/Ge followed by 4 KA Au to form layer 28;

f. lap substrate 20 to approximate thickness of 4–5 mils, and etch off further 1 mil;

g. evaporate approximately 2.25KA Au/Ge onto etched surface to form layer 29;

h. alloy in N$_2$ at approximately 600°C for 1 minute;

i. open 1 mil stripes on 7.5 mil centres in layer 28 using conventional photoresist masking and KI-I$_2$ etchant, to form openings 30, central between windows 26 and 50$\mu$ stripe opened in step (d), defining contacts 28a and 28b;

j. cleave wafer into chips along 50$\mu$ stripes and mount.

The device illustrated in FIG. 4 is a Schottky barrier type device. It again comprises a substrate 20 and four epitaxially grown layers 21, 22, 23 and 24. The layers 21, 22, 23 and 24 are grown as for the device of FIG. 3, the only difference being that layer 24 has the following characteristics:

| Layer | Type | Al | Te | Ge | Thickness | Carrier Concentration |
|---|---|---|---|---|---|---|
| 24 | p-GaAs | — | — | 20 | 1$\mu$ | ~1 × 10$^{17}$cm$^{-3}$ |

After growing the layers 21 to 24 and cleaning, a multiplicity of devices are formed on a single wafer as follows:

a. skin diffuse layer 24 at 600°C for 15 minutes, ZnAs$_2$ source, in semi-sealed capsule;

b. lap substrate to approximate thickness of 3.5 mils;

c. evaporate 2.25K A Au/Ge on substrate 20 to form layer 29;

d. alloy at 650°C for 3 minutes in N$_2$;

e. mask layer 24 to define pattern of 8$\mu$ stripes wih photoresist;

f. etch layer 24 for 15 seconds with 30H$_2$ O$_2$/1NH$_4$ OH to remove skin diffusion from regions between stripes to define regions 31;

g. remove photoresist;

h. evaporate 2K A Au on layer 24 to form layer 32;

i. open 5$\mu$ stripes in layer 32 along edges of regions 31, to define contacts 32a and 32b;

j. cleave and mount.

FIG. 5 illustrates a device of the metal insulator semiconductor type. Again, on a substrate 20 are epitaxially grown the four layers 21, 22, 23 and 24 of the same form as in FIG. 3. Layer 24 is masked and then zinc diffused to form region 35. Oxide layer 36 is formed, masked and etched to define areas 37 and p-type contact layer 38 is formed on the diffused region 35. Field contacts 39 are formed on the oxide areas 37, and then the wafer is cleaved and mounted.

Each device has at least three contacts. Thus a device as in FIG. 3 has contacts 28a, 28b and 29. Contacts 28a and 29 correspond to contact 16 and a back contact, not shown, in FIG. 1 and are the contacts by which a current is applied to the device. Normally, on application of the current, there will be spreading in layers 23 and 24, as occurs in FIG. 1. By applying a voltage to contacts 28b the current spread is reduced, as in FIG. 2. It will be appreciated that the voltage applied via contact 28a and 29 can be such that, although the current density at contact 28a is sufficient for lasing action, due to the spreading action, at the active layer 22 the current density is below that necessary for lasing. If now a voltage is applied to contacts 28b this reduces the current spread, and increases the current density to above threshold value. Lasing occurs. Thus the lasing action can be rapidly switched on and off, or modulated, by applications of voltages — or signals — to the contacts 28b. As the voltage is applied across a high resistivity junction, the power required for such switching is small — for example less than 10$^{-4}$ mw.

A similar action occurs with the device illustrated in FIGS. 4 and 5. In FIG. 4 the normal contacts for the device — to act as a laser — are contacts 32a and 29. Contacts 32b are the "control" contacts to which a voltage is applied to control current spread. Similarly, in FIG. 5 contacts 38 and 29 are the normal layer contacts, and contacts 39 are the "control" contacts.

In addition to applying a voltage to the "control" contact to switch the lasing action on and off, voltages can be applied to eliminate unwanted higher order modes by reducing current spreading above the lasing threshold. In conventional devices, the width of the contact is required to be a very narrow stripe to ensure that the lowest order made is produced. The invention enables the stripe width to be less critical.

Less power will normally be required to switch the laser on and off by means of the additional voltage applied to the "control" contacts, than switching the laser device off and on. A device incorporating the invention is suitable for a pulse modulation system.

What is claimed is:

1. A variable stripe width semiconductor heterojunction laser comprising:

a substrate;

two sequential layers of semiconductor material of opposite polarity on said substrate, to form a heterojunction;

a contact stripe on an outer layer of said device for the application of a forward bias to said heterojunction to produce a lasing region in said device; and at least one further contact on said outer layer and adjacent to said contact stripe for the application of a reverse bias to produce a depletion region, such that the current spread from said contact stripe in said device is reduced to produce a current density in said lasing region above a threshold value.

2. A laser as claimed in claim 1, said device comprising a p-n junction device having four sequential epitaxially grown layers, a diffusion zone extending through the outer layer and into the layer beneath said outer layer;

a contact stripe on said diffusion zone in said outer layer, and a further contact on said outer layer on each side of said contact stripe, out of said diffusion zone.

3. A laser as claimed in claim 1, said device comprising a Schottky barrier device having four sequential epitaxially grown layers;

a skin diffused area on the outer layer;

a contact stripe on said skin diffused area on the outer layer; and a further contact on said outer layer, on each side of said contact stripe, out of said diffused area.

4. A laser as claimed in claim 1, said device comprising a metal insulator semiconductor type of device having four sequential epitaxially grown layers, a diffused region in the outer layer;

a contact stripe on said diffused region of said outer layer and a further contact on said outer layer on either side of said contact stripe, out of said diffused region.

5. A variable stripe width semiconductor heterojunction laser including means for rapidly switching from non-lasing to lasing condition, comprising:

a substrate of semiconductor material;

a first confining layer on said substrate, an active layer on said first confining layer and a second confining layer on said active layer, each layer of semiconductive material, and said active layer of opposite polarity to one of said confining layers to form a heterojunction, said active layer doped to produce a lasing region on application of a forward bias to said heterojunction;

a contact stripe on an outer layer of said device for application of said forward bias to said heterojunction to produce a current density in said active layer less than the lasing threshold value; and at least one further contact on said outer layer, adjacent to said contact stripe, for application of a reverse bias to said heterojunction to reduce the current spread from said contact stripe and to increase the current density in said lasing region in said active layer above said threshold value.

* * * * *